US012648113B2

(12) United States Patent

Farkas et al.

(10) Patent No.: US 12,648,113 B2

(45) Date of Patent: Jun. 2, 2026

(54) ELECTRICALLY CONTROLLED VENTURI TO INHIBIT LEAKS IN A DIRECT LIQUID COOLING SYSTEM

(71) Applicant: DELL PRODUCTS L.P., Round Rock, TX (US)

(72) Inventors: Sandor Farkas, Round Rock, TX (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 35 days.

(21) Appl. No.: 18/818,936

(22) Filed: Aug. 29, 2024

(65) Prior Publication Data

US 2026/0068087 A1 Mar. 5, 2026

(51) Int. Cl.
| | |
|---|---|
| *H05K 7/20* | (2006.01) |
| *F16K 31/06* | (2006.01) |
| *F16L 55/10* | (2006.01) |
| *H01F 7/20* | (2006.01) |

(52) U.S. Cl.
CPC ......... *H05K 7/20272* (2013.01); *F16K 31/06* (2013.01); *F16L 55/1003* (2013.01); *H01F 7/20* (2013.01)

(58) Field of Classification Search
CPC ................................................... F16L 55/1003
See application file for complete search history.

(56) References Cited

U.S. PATENT DOCUMENTS

| | | | |
|---|---|---|---|
| 9,763,364 B1 * | 9/2017 | Amoah-Kusi | ..... H05K 7/20772 |
| 10,964,469 B2 | 3/2021 | Shin et al. | |
| 2008/0211193 A1 | 9/2008 | Li | |
| 2013/0213512 A1 * | 8/2013 | Meinke | .................... F16J 15/43 |
| | | | 138/89 |
| 2019/0333676 A1 * | 10/2019 | Shin | ......................... H01F 38/14 |
| 2022/0045592 A1 * | 2/2022 | Huang | ................. G06F 1/1615 |
| 2022/0171470 A1 * | 6/2022 | Drezet | .................... G06F 3/016 |

* cited by examiner

*Primary Examiner* — Kelsey E Cary
(74) *Attorney, Agent, or Firm* — Larson Newman, LLP

(57) ABSTRACT

A liquid cooling system includes first and second coolant tubes and a coupler to couple the first coolant tube to the second coolant tube. The first coolant tube receives coolant liquid from a first element of the liquid cooling system. The second coolant tube provides the coolant liquid to a second element of the liquid cooling system. The coupler is configured to receive an electrical signal to constrict a flow of the coolant liquid.

18 Claims, 4 Drawing Sheets

Leak Detected/
DC Current Applied)

200

(No Leak/
No Current)

Leak Detected/
DC Current Applied)

ELECTRICALLY CONTROLLED VENTURI TO INHIBIT LEAKS IN A DIRECT LIQUID COOLING SYSTEM

FIELD OF THE DISCLOSURE

This disclosure relates to information handling systems, and more particularly relates to electrically controlling a venturi to stop leaks in a direct liquid cooling (DLC) system in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A liquid cooling system may include first and second coolant tubes and a coupler to couple the first coolant tube to the second coolant tube. The first coolant tube may receive coolant liquid from a first element of the liquid cooling system. The second coolant tube may provide the coolant liquid to a second element of the liquid cooling system. The coupler may be configured to receive an electrical signal to constrict a flow of the coolant liquid

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
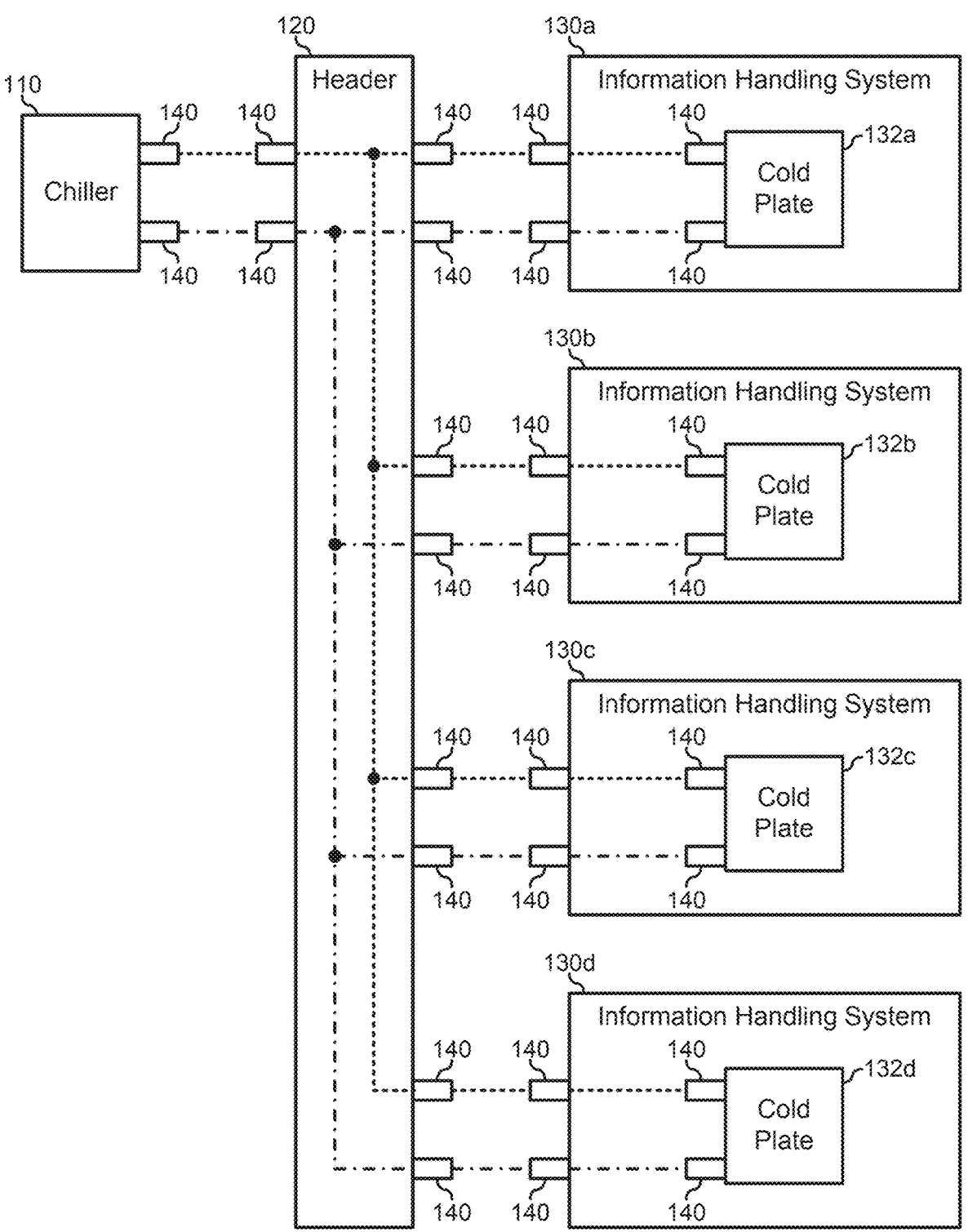
FIG. 1 is a block diagram of a direct liquid cooling (DLC) system according to an embodiment of the present disclosure.

FIG. 1 illustrates a direct liquid cooling (DLC) system 100. DLC system 100 provides cooling for critical components within information handling systems, for example in a data center or other high-density computing environment. DLC system 100 includes a chiller 110, a header 120 and a number of information handling systems 130a-d. Each one of information handling systems 130a-d include one or more components that generate large amounts of heat in the enclosure of their respective information handling systems. For example, information handling systems 130a-d may include one or more processors (CPUs), chipset components, graphics processing units (GPUs), memory devices, storage devices, or the like, that represent a large portion of the thermal load of the respective information handling systems.

In order to remove the heat generated in an information handling system, manufacturers and users are turning to DLC systems like DLC system 100 to more efficiently and effectively manage the heat generated within their information handling systems and data centers. In this regard, information handling systems 130a-d each include one or more cold plate 132a-d to remove the heat from the high-heat generating components. As such, chiller 110 operates to supply chilled coolant liquid (as illustrated by the dotted lines) to header 120. Header 120 includes a cold manifold that distributes the chilled coolant liquid to each of cold plates 132a-d. Cold plates 132a-d are configured to be thermally connected to the high-heat generating components, where the heat from the components is thermally transferred to the coolant liquid. The heated coolant liquid (indicated by the doted/dashed lines) is returned from cold plates 132a-d to header 120 where a cold manifold combines the heated coolant liquid for return to chiller 110. In this regard, DLC system 100 is a closed-loop system, rechilling the coolant liquid for redistribution throughout the DLC system.

DLC system 100 is characterized by the need to connect the components together to move the coolant liquid throughout the DLC system. In particular, each component (e.g., chiller 110, header 120, and cold plates 132a-d includes couplers 140 that couple the respective component to tubing that spans the distance between the respective components. DLC systems similar to DLC system 100 are prone to develop liquid coolant leaks. This presents a particular hazard when a leak develops within the enclosure of information handling systems 130a-d, where sensitive electronic components can be damaged, for example, when the liquid coolant bridges electrical circuits creating short circuits. Various mechanisms for mitigating liquid coolant leaks may include the application of highly absorbent material on the printed circuit boards (PCBs) of the information handling system, leak detection mechanisms such as leak detection ropes and the like, and the consequent shutting down of the information handling system when a liquid coolant leak is detected. It has been understood by the inventors of the current disclosure that couplers such as couplers 140 are more prone to develop liquid coolant leaks than are the components and tubing that are connected by the couplers.

Figure 2:
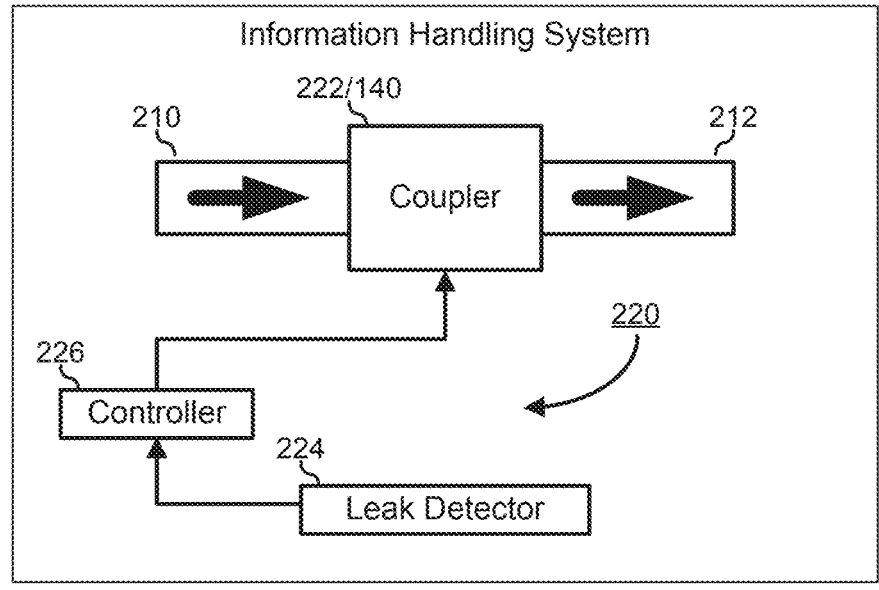
FIG. 2 is a block diagram of an information handling system of the DLC system of FIG. 1.

FIG. 2 illustrates a portion of an exemplary information handling system 200 which includes a DLC system to provide cooling for one or more component of the information handling system. Information handling system 200 includes coolant tubes 210 and 212 that are coupled together by a coupler 222 similar to coupler 140, as described above. Information handling system 200 further includes a liquid coolant leak detection and mitigation system 220 (hereinafter "detection system 220"). Detection system 220 operates to detect a coolant leak and to electrically mitigate the coolant leak via coupler 222. As such, detection system 220 includes coupler 222, a leak detector 224, and a controller 226. Coupler 222 operates to receive an electrical signal from controller 226 that engages the coupler to minimize or stop the coolant leak, as described further below. Leak detector 224 operates to detect a coolant leak from coupler 222 and to provide an electrical signal to controller 226 indicating that the coupler is leaking.

In a particular embodiment, leak detector 224 is localized to coupler 222 such that a coolant leak that is detected by the leak detector is highly likely to be from the coupler. In this case, detection system 220 operates to control only coupler 222 to minimize or stop the coolant leak. That is, leak detector 224 is a single-point leak detector that is situated to detect single-point coolant leaks from coupler 222, and controller 226 operates on a one-to-one correlation between the leak detector and the coupler. In other embodiments, leak detector 224 provides a wider coverage of more than one coupler similar to coupler 222, and the detection of a coolant leak results in the minimization or stoppage of the coolant leak by engaging multiple couplers, as needed or desired. The methods and mechanisms for detecting a coolant leak in an information handling system are known in the art and will not be further described herein, except as may be needed to illustrate the current embodiments.

Figure 3A:
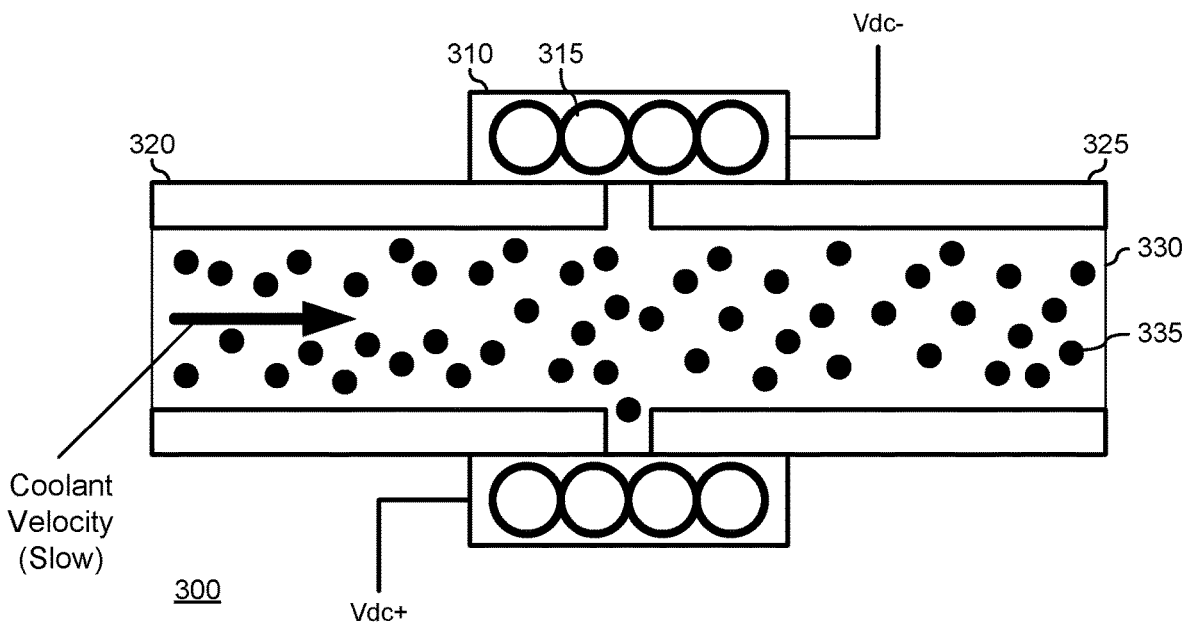
FIGS. 3A and 3B are cutaway views of a portion of a DLC system according to an embodiment of the present disclosure.
Figure 3B:
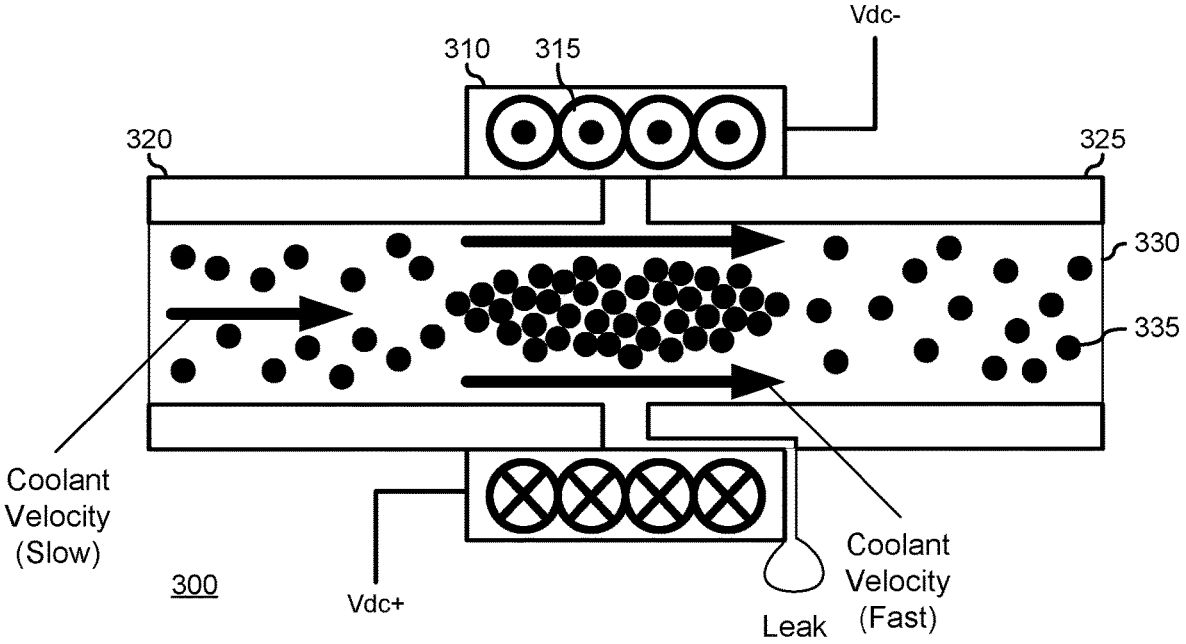

FIGS. 3A and 3B illustrate a portion of a DLC system 300 including a coupler 310 that couples coolant tubes 320 and 325 together. FIGS. 3A and 3B more particularly illustrate a cross section of coupler 310 and coolant tubes 320 and 325. A coolant liquid 330 flows in the illustrated direction from coolant tube 320 to coolant tube 325. Coolant liquid 330 flows with a particular velocity which, for the purposes of the current disclosure, will be described as being a low velocity flow, or alternatively that coolant velocity is slow. Coupler 310 is shown as having a slip-fitting to coolant tubes 320 and 325, such as where the coolant tubes are glued, doped, or otherwise sealed to the coupler. However, other coupling mechanisms are herein contemplated, such as threaded fittings, compression couplings, or other types of coupling mechanisms as needed or desired. Further, it will be understood that coupler 310 and coolant tubes 320 and 325 may typically have a circular cross section, but this is not necessary, and other cross sectional configurations, such as square cross sections, rectangular cross sections, ovoid cross sections, or other cross sectional configurations may be utilized, as needed or desired. Further, coolant tubes 320 and 325 are illustrated as having a common size, but this is not necessary, and the coolant tubes may have differing sizes and coupler 310 may be configured to adapt the relative sizes of the coolant tubes, as needed or desired.

Coupler 310 includes a wire winding 315 around the perimeter of the coupler that is connected to a positive electrical contact (Vdc+) and a negative electrical contact (Vdc−). Here, it will be understood that a current applied to wire winding 315 will result in the creation of a strong magnetic field on the inside of coupler 310. In a particular embodiment, coolant liquid 330 includes ferromagnetic particles 335 that flow with the coolant liquid, as illustrated in FIG. 3A by the even distribution of the ferromagnetic particles. Thus FIG. 3A will be understood to represent a condition where no current is being provided to wire winding 315, and ferromagnetic particles 335 move freely with the flow of coolant liquid 330.

FIG. 3B illustrates a case where DLC system 300, and particularly coupler 310 has developed a coolant leak on the coolant tube 325 side. In this case, a detection system similar to detection system 220, as described above, may operate to detect the coolant leak, and to apply a current to wire winding 315, creating a strong magnetic field inside of coupler 310. Ferromagnetic particles 335 are held within the magnetic field to form a constriction in the flow of coolant liquid 330. Such a constriction is known to cause a venturi effect at the narrowing of the flow, resulting in an increase in the coolant velocity in the region of the constriction. In keeping with the venturi effect, the increase in the coolant velocity is accompanied by an associated reduction in pressure at the site of the leak, thereby slowing the leak. It will be understood that, if a high enough current is applied to wire winding 315, the induced magnetic field will be strong enough to retain ferromagnetic particles 335 to completely block the flow of coolant liquid 330, as needed or desired. Ferromagnetic particles 335 may include magnetizable metallic particles, carboxyl (chromium dioxide) particles, or the like, and may be wholly formed of the associated ferromagnetic material, or may be formed as a coating on an underlying structure, such as a polystyrene particle, or the like. Note that the electrical contacts to wire winding 315 are illustrated as being direct current (DC) contacts (i.e., Vdc+ and Vdc−), but this is not necessarily so, and an alternating current (AC) signal or another type of electrical signal may be provided as needed or desired.

Figure 4:
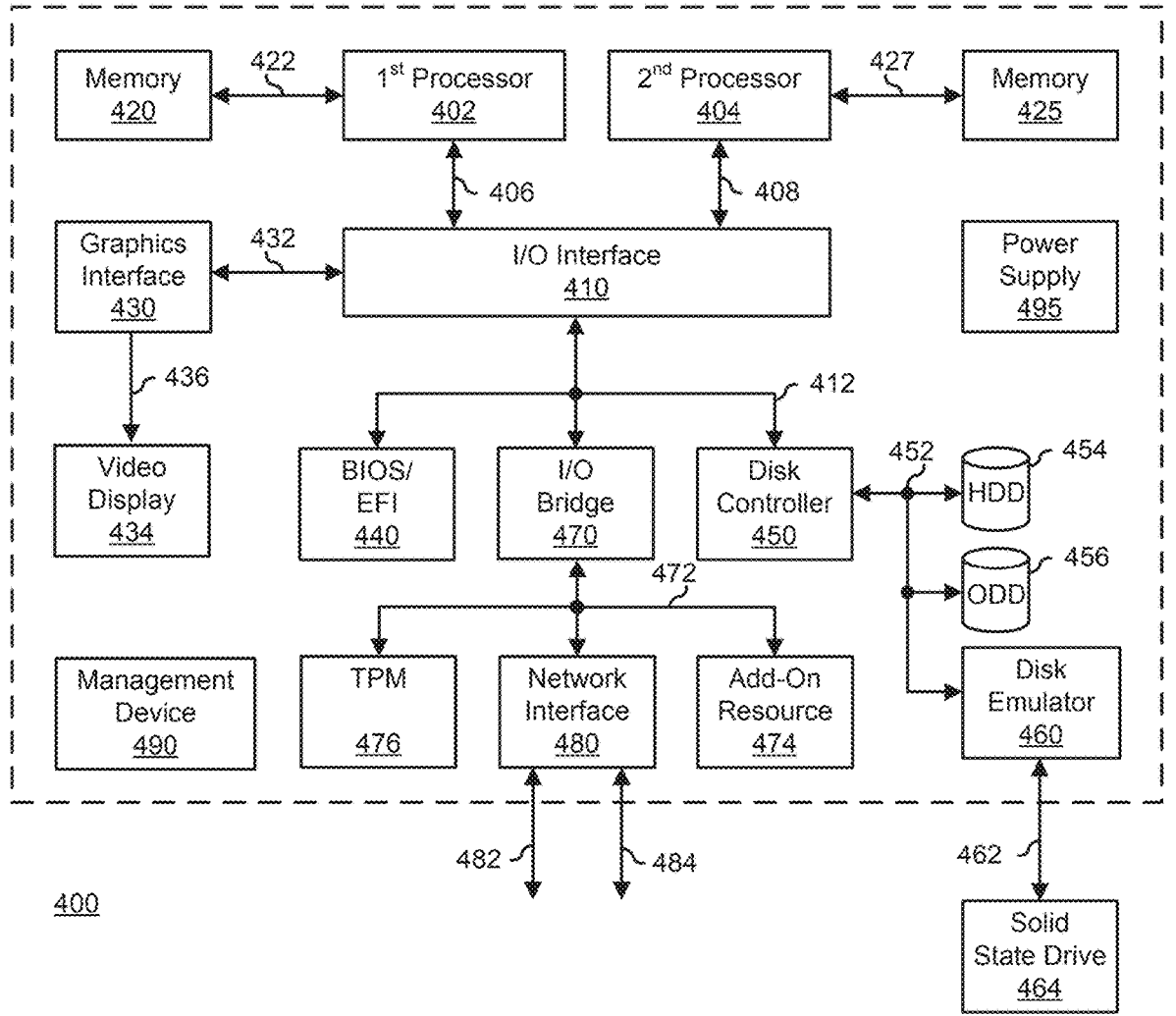
FIG. 4 is a block diagram illustrating a generalized information handling system according to another embodiment of the present disclosure.

FIG. 4 illustrates a generalized embodiment of an information handling system 400 similar to information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408.

Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 where peripheral interface 472 and the I/O channel are of the same type, and the I/O bridge translates information from a format suitable to the I/O channel to a format suitable to the peripheral channel 472 where they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I²C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 where the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed:

1. A liquid cooling system, comprising:
a first coolant tube to receive coolant liquid from a first element of the liquid cooling system, wherein the coolant liquid includes ferromagnetic particles;
a second coolant tube to provide the coolant liquid to a second element of the liquid cooling system; and
a coupler to couple the first coolant tube to the second coolant tube;
wherein the coupler is configured to receive an electrical signal to constrict a flow of the coolant liquid.

2. The liquid cooling system of claim 1, wherein the coupler includes a wire winding around a perimeter of the coupler, the wire winding to receive the electrical signal.

3. The liquid cooling system of claim 2, wherein, when the coupler receives the electrical signal, the wire winding creates a magnetic field within the coupler.

4. The liquid cooling system of claim 3, wherein, when the coupler receives the electrical signal, the magnetic field within the coupler creates a floating obstruction of the ferromagnetic particles.

5. The liquid cooling system of claim 4, wherein, when the electrical signal has a first value, the floating obstruction partially obstructs a flow of the coolant liquid.

6. The liquid cooling system of claim 5, wherein the floating obstruction reduces a leak in the liquid cooling system.

7. The liquid cooling system of claim 5, wherein, when the electrical signal has a second value greater than the first value, the floating obstruction fully obstructs the flow.

8. The liquid cooling system of claim 1, wherein the electrical signal is received in response to a detection of a coolant liquid leak.

9. The liquid cooling system of claim 8, wherein the leak is at the coupler.

10. A method, comprising:
providing, in a liquid cooling system, a first coolant tube to receive coolant liquid from a first element of the liquid cooling system, wherein the coolant liquid includes ferromagnetic particles;
providing, in the liquid cooling system, a second coolant tube to provide the coolant liquid to a second element of liquid cooling system;
providing, in the liquid cooling system, a coupler to couple the first coolant tube to the second coolant tube; and
receiving, by the coupler, an electrical signal to constrict a flow of the coolant liquid.

11. The method of claim 10, further comprising:
providing, in the coupler, a wire winding around a perimeter of the coupler; and
receiving, by the wire winding, the electrical signal.

12. The method of claim 11, wherein, when the coupler receives the electrical signal, the wire winding creates a magnetic field within the coupler.

13. The method of claim 12, wherein, when the coupler receives the electrical signal, the magnetic field within the coupler creates a floating obstruction of the ferromagnetic particles.

14. The method of claim 13, wherein, when the electrical signal has a first value, the floating obstruction partially obstructs a flow of the coolant liquid.

15. The method of claim 14, wherein the floating obstruction reduces a leak in the liquid cooling system.

16. The method of claim 14, wherein, when the electrical signal has a second value greater than the first value, the floating obstruction fully obstructs the flow.

17. The method of claim 10, wherein the electrical signal is received in response to a detection of a coolant liquid leak.

18. A liquid cooling system, comprising:
a first coolant tube to receive coolant liquid from a first element of the liquid cooling system, wherein the coolant liquid includes ferromagnetic particles;
a second coolant tube to provide the coolant liquid to a second element of the liquid cooling system;
a coupler to couple the first coolant tube to the second coolant tube; and
a leak detector configured to provide an electrical signal in response to a leak of the coolant liquid;
wherein the coupler is configured to receive the electrical signal and to create a floating obstruction of the ferromagnetic particles within the coupler to constrict a flow of the coolant liquid.

* * * * *